(12) United States Patent
Asakawa

(10) Patent No.: US 6,933,238 B2
(45) Date of Patent: Aug. 23, 2005

(54) METHOD FOR MANUFACTURING SEMICONDUCTOR DEVICE

(75) Inventor: Kazuhiko Asakawa, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/748,279

(22) Filed: Dec. 31, 2003

(65) Prior Publication Data

US 2004/0241949 A1 Dec. 2, 2004

(30) Foreign Application Priority Data

May 30, 2003 (JP) ......................................... 2003-154149

(51) Int. Cl.$^7$ ............................................. H01L 21/311
(52) U.S. Cl. ..................... 438/700; 438/706; 438/296; 438/359; 438/424
(58) Field of Search ................................ 438/424, 221, 438/296, 359, 634, 637, 660, 663, 680, 692, 700, 706, 740, 770, 775

(56) References Cited

U.S. PATENT DOCUMENTS

| 6,245,684 B1 | | 6/2001 | Zhao et al. | |
| 6,277,710 B1 | * | 8/2001 | Kim et al. | 438/431 |
| 6,339,018 B1 | * | 1/2002 | Ballantine et al. | 438/586 |
| 6,426,271 B2 | | 7/2002 | Chen et al. | |
| 6,432,797 B1 | * | 8/2002 | Cha et al. | 438/424 |
| 6,503,802 B2 | | 1/2003 | Kim | |
| 6,638,813 B1 | * | 10/2003 | Tzeng et al. | 438/244 |
| 6,709,951 B2 | * | 3/2004 | Beyer et al. | 438/424 |
| 6,740,592 B1 | * | 5/2004 | Doong | 438/700 |

FOREIGN PATENT DOCUMENTS

| JP | 2000-277604 | 10/2000 |
| JP | 2001-044273 | 2/2001 |
| JP | 2001-118919 | 4/2001 |
| JP | 2001-267416 | 9/2001 |

* cited by examiner

*Primary Examiner*—David Nhu
(74) *Attorney, Agent, or Firm*—Rabin & Berdo, P.C.

(57) ABSTRACT

A method for manufacturing a semiconductor element of the present invention includes the steps of: forming, on a substrate, a protection oxide film, a nitride film, an insulation film for protecting the nitride film; forming a trench; etching the insulation film to widen its aperture toward an active region; forming a thermal oxidation film inside the trench; etching the nitride film using the insulation film as a mask to slide a step defined by the thermal oxidation film and the nitride film from an upper edge of the trench toward the active region; forming a filling oxide film; exposing the nitride film; etching the filling oxide film; and removing the nitride oxide film and the protection oxide film.

19 Claims, 12 Drawing Sheets

METHOD FOR MANUFACTURING SEMICONDUCTOR DEVICE

BACKGROUND OF THE INVENTION

1. Field of the Invention

The present invention relates to a technology for separating elements in a method for manufacturing a semiconductor element and, particularly, to the manufacturing method using the Shallow Trench Isolation (STI) technology.

2. Description of Related Art

In recent years, along with the microfabrication of a semiconductor element, the STI technology for forming a trench which is filled with an insulating material has been used as a technology for separating the elements. The conventional STI process flow is explained below with reference to FIGS. 9A to 10B.

After forming a protection oxide film 502 on a substrate 501, a nitride film 503 is formed. Then, a resist pattern (not shown) is formed on the nitride film 503 employing a known lithography technology to form a trench 505 in a region for separating semiconductor elements. By using the resist pattern, the nitride film 503, the protection oxide film 502, and the substrate 501 are etched by dry etching successively to form the trench 505 (FIG. 9A).

After forming the trench, the resist material is removed, and then a thermal oxidation (rounding oxidation) is performed to form a rounding oxide film 506 which is a thermal oxidation film, thereby preventing damages on a silicon surface of an inside of a trench, crystallization defects, and contamination and rounding corners of an upper edge of the trench. Then, the trench inside is filled with a CVD oxide film 507 (FIG. 9B). After that, the CVD oxide film 507 on the nitride film 503 is removed (FIG. 9C).

Next, etching (L) is performed in order to adjust the height of the CVD oxide film inside the trench using hydrofluoric acid, so that a surface of an active region is substantially level with a surface of the element separation region (FIG. 10A). After the etching, the nitride film 503 is removed by using a hot phosphoric acid solution, and the protection oxide film 502 on the silicon substrate 501 is removed by using hydrofluoric acid (FIG. 10B).

Next, a shape abnormality indicated by D1 in FIG. 10A, which is a depression in the CVD oxide film and is called a divot, occurs on an upper edge of the CVD oxide film. The underlayer structure before the formation of the CVD oxide film for filling up the trench includes a step 508 (FIG. 9B) which is defined by the rounding oxide film 506 and the nitride film 503 on the trench upper edge, and the cause of the divot is considered to be a difference in hydrofluoric etching rate which is caused since the material of the CVD oxide film formed on the step is different from that of other regions.

The size of the divot is increased with an increase in total amount of the hydrofluoric acid etching performed after the removal of the nitride film as indicated by D2 in FIG. 10B. The CVD oxide film on the trench upper edge is depressed due to the divot, and the succeeding hydrofluoric acid pretreatment causes a reduction in thickness of the thermal oxidation film (rounding oxide film) at the trench upper edge and an exposure of the trench upper edge. Thus, the divot deteriorates element properties As a method of reducing the size of the divot, a process flow shown in FIGS. 11A to 12C has been proposed. After forming a trench (FIG. 11A) and a rounding oxide film, a nitride film is subjected to an isotropic etching process, which is sometimes referred to as nitride film recess etching, employing wet or dry etching using hot phosphoric acid or the like, so that the step 509 defined by the rounding oxide film and the nitride film is slid from a position directly above an upper edge of the trench to an inside an active region (FIG. 11B).

The rest of the process (after FIG. 11C) wherein the trench is filled with a CVD oxide film is the same as that of the conventional technology mentioned earlier. By the recession of the nitride film, the position on which the divot has occurred is slid to the active region by the silicon recession amount from the conventional trench upper edge (FIG. 12B), and the size of the divot is reduced in the following hydrofluoric acid etching, thereby preventing the depression in the CVD oxide film at the trench upper edge as shown in FIG. 12C.

However, in the above-mentioned method employing the nitride film recess etching, an accurate controllability on the amount of nitride film recess etching and in-plane and inter-plane uniformity are required. With unstable control, a variation in a nitride film thickness occurs, and such variation is increased after post-treatment CMP to lead to a difficulty in setting an etching amount for adjusting the height of the CVD oxide film inside the trench after CMP.

The present invention has been accomplished in view of the problems detected with the conventional semiconductor element manufacturing methods, and an object thereof is to reduce the occurrence of the divot and to provide a novel and improved semiconductor element manufacturing method which is free from the difficulty in setting the etching amount for adjusting the height of the CVD oxide film inside the trench due to increase of variation in the nitride film thickness.

SUMMARY OF THE INVENTION

In order to solve the above problems, according to a first aspect of the present invention, there is provided a method for manufacturing a semiconductor element using the STI technology, comprising: a step of forming, on a substrate on which a protection oxide film and a nitride film are formed in this order, an insulation film for protecting the nitride film; a step of patterning an element separation region by photolithography and etching the films and the substrate to form a trench; a step of etching the insulation film to widen an aperture toward an inside of an active region; a step of performing a heat treatment to form a thermal oxidation film inside the trench; a step of etching the nitride film using the insulation film as a mask and sliding (moving) a step defined by the thermal oxidation film and the nitride film from an upper edge of the trench toward the inside of the active region; a step of burying the trench to form a filling oxide film; a step of selectively etching the filling oxide film and the insulation film to expose the nitride film; a step of etching the filling oxide film inside the trench so that a surface of the substrate is substantially level with a surface of the filling oxide film; and a step of removing the nitride film and the protection oxide film.

The insulation film may preferably be an oxide film which protects the nitride film surface from being etched in the nitride film recess etching and reduces a variation in nitride film thickness. CMP can be employed for the etching on the filling oxide film, and it is possible to reduce the variation in nitride film thickness on the substrate by employing conditions under which the nitride film is scarcely etched.

The aperture of the insulation film may preferably be widened by about 50 nm toward the inside of the active region. More specifically, the nitride film is recessed by about 50 nm to shift the step defined by the nitride film and the thermal oxidation film from the trench upper edge, so that the divot is formed near the active region, thereby preventing a portion of the thermal oxidation film on the trench upper edge from being reduced in thickness and preventing the trench upper end from being exposed. Thus, deterioration in element properties is prevented.

In accordance with a second aspect of the present invention, there is provided a method for manufacturing a semiconductor element, comprising: a step of forming, on a substrate on which a protection oxide film and a nitride film are formed in this order, a polysilicon film for protecting the nitride film; a step of etching the films and the substrate to form a trench on an element separation region; a step of performing a heat treatment to form a thermal oxidation film inside the trench and to modify the polysilicon film into an oxide film; a step of etching the nitride film using the oxide film modified from the polysilicon film as a mask and moving a step defined by the thermal oxidation film and the nitride film closer to an active region; a step of forming a filling oxide film for burying the trench; a step of selectively etching the filling oxide film and the oxide film to expose the nitride film; a step of etching the filling oxide film inside the trench so that a surface of the substrate is substantially level with a surface of the filling oxide film; and a step of removing the nitride film and the protection oxide film.

The method according to the second aspect is characterized in that the polysilicon film formed in place of the insulation film to protect the nitride film is modified into the oxide film by the heat treatment for forming the thermal oxidation film inside the trench, and an effect achieved by the method is the same as that achieved by the method according to the first aspect. An amorphous silicon film may be used in place of the polysilicon film.

In the case where an oxide film is used as the insulation film for protecting the nitride film when using hydrofluoric acid in a pretreatment for forming the thermal oxide inside the trench, the oxide film can be removed in some cases; however, the polysilicon film is free from such removal. Further, since an edge of the aperture of the polysilicon film (oxide film) is recessed spontaneously to be inside the active region when the polysilicon film is modified into the oxide film, it is unnecessary to etch the polysilicon film separately.

In accordance with a third aspect of the present invention, there is provided a method for manufacturing a semiconductor element, comprising: a step of forming, on a substrate on which a protection oxide film and a nitride film are formed in this order, an insulation film for protecting the nitride film; a step of etching the films and the substrate on an element separation region to form a trench; a step of performing a heat treatment to form a thermal oxidation film inside the trench; a step of forming on a whole surface of the substrate an oxide film to be used for forming spacers and then etching back by dry etching to form oxide film sidewall spacers having a step below the substrate surface; a step of forming a filling oxide film for burying the trench; a step of selectively etching the filling oxide film and the insulation film to expose the nitride film; a step of etching the filling oxide film inside the trench and the oxide film sidewall spacers so that the substrate surface is substantially level with a surface of the filling oxide film; and a step of removing the nitride film and the protection oxide film.

In the method according to the third aspect, the oxide film spacers for covering the step defined by the nitride film and the thermal oxidation film, i.e. the sidewalls of the nitride film and the trench, are formed so as not to form the filling oxide film on the step defined by the nitride film and the thermal oxidation film. Since the step formed as a result of forming the spacers is below the substrate inside the trench, the film material of the spacer step is modified during the formation of the filling oxide film; however, the method is free from the influence of the hydrofluoric acid etching on the filling oxide film and causes no divot.

The insulation film on the nitride film is not always necessary, but it is preferred to protect the nitride film in the formation of the oxide film for the spacers, and the insulation film is easily removed in a post-treatment. CMP can be employed for the etching on the filling oxide film, and it is possible to reduce a variation in nitride film thickness on the substrate by employing conditions under which the nitride film is scarcely etched.

In accordance with a fourth aspect of the invention, there is provided a method for manufacturing a semiconductor element, comprising: a step of forming, on a substrate on which a protection oxide film and a nitride film are formed in this order, an insulation film for protecting the nitride film; a step of etching the films and the substrate on an element separation region to form a trench; a step of performing a heat treatment to form a thermal oxidation film inside the trench; a step of forming a polysilicon film on a whole surface of the substrate and then etching back by dry etching to form spacers of polysilicon film having a step below the substrate surface on the trench sidewall; a step of performing a heat treatment to modify the polysilicon film sidewall spacers into oxide film sidewall spacers; a step of forming a filling oxide film for burying the trench; a step of selectively etching the filling oxide film and the insulation film to expose the nitride film; a step of etching the filling oxide film inside the trench and the spacers so that the substrate surface is substantially level with a surface of the filling oxide film; and a step of removing the nitride film and the protection oxide film.

The oxide film spacers having the step below the substrate surface are formed to cover the sidewalls of the nitride film and the trench in the method according to the fourth aspect, and the method achieves an effect same as that achieved by the third aspect to be free from the divot generation. The oxide film spacers are formed by modifying the polysilicon film spacers by the heat treatment. The same effect is achieved by using an amorphous silicon in place of the polysilicon film.

Since the polysilicon film is etched in the formation of the sidewall spacers, it is possible to leave the thermal oxidation film on a bottom of the trench almost unetched by employing etching conditions wherein selectivity ratios for the polysilicon film and the oxide film are higher. Thus, it is possible to prevent damage and crystal defect from occurring on the substrate on the trench bottom during the formation of the filling oxide film.

BRIEF DESCRIPTION OF THE DRAWINGS

FIG. 6C is the section after removing a nitride film and a protection oxide film.

DETAILED DESCRIPTION OF THE INVENTION

Figure 1A:
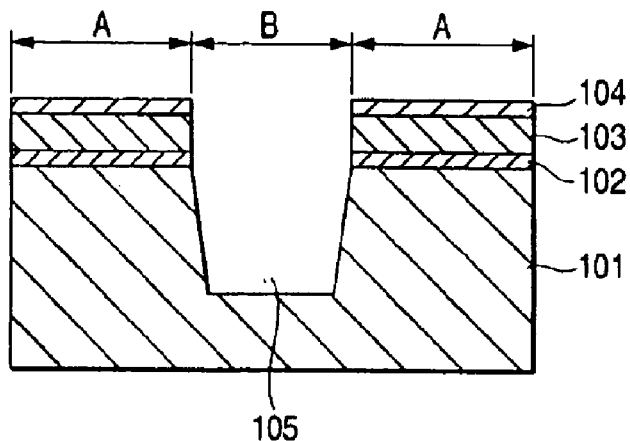
FIGS. 1A to 1C are sectional views schematically showing a part of a process according to a first embodiment, wherein: shown in FIG. 1A is a section after forming a trench; shown in FIG. 1B is the section after performing etching of a set amount for recession of a protection film of a nitride film; and shown in FIG. 1C is the section after performing nitride film recess etching and forming on a whole surface an oxide film with which the trench is filled.

Hereinafter, a method for manufacturing a semiconductor element will be described in accordance with preferred embodiments and with reference to the accompanying drawings. In addition, in the present specification and the drawings, constituent elements having a substantially identical function will be denoted by an identical reference numeral thereby to omit repetition of an explanation for such constituent elements.

(First Embodiment)

Shown in FIGS. 1A to 2C is an STI process flow according to the first embodiment. A protection oxide film 102 having a thickness of about 15 nm is formed on a substrate 101 by oxidation to protect the substrate 101, and then a nitride film 103 which will be used as an etching stopper is formed by LPCVD, followed by forming a CVD oxide film, for example, having a thickness of about 70 nm on the nitride film 103 by LPCVD as an insulation film 104 for protecting the nitride film 103.

After that, for the purpose of forming a trench 105 on an element separation region B, a resist pattern (not shown) is formed on the insulation film 104 in an active region A using a known lithography technology. By the use of this resist pattern, the insulation film 104, the nitride film 103, the protection oxide film 102, and the substrate 101 are successively etched by dry etching to form the trench 105 (FIG. 1A). The resist material is removed after the etching.

Figure 1B:
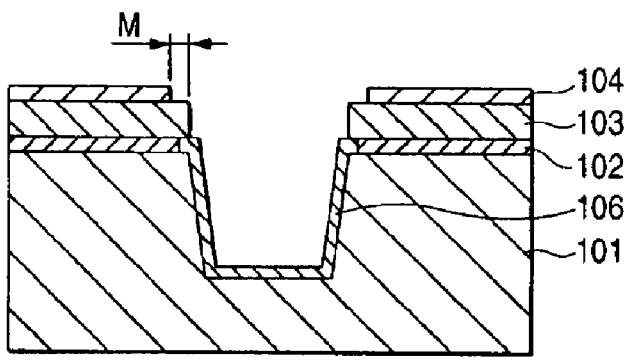

Next, recess etching is performed on the insulation film 104 (CVD oxide film) using hydrofluoric acid and the like, an amount of the recess etching being identical with a preset nitride film recession amount M. Then, a heat treatment (rounding oxidation) is performed for the purposes of preventing damage and occurrence of crystal defect on a silicon surface of the trench 105 and rounding corners of upper edges of the trench 105 to form a thermal oxidation film 106 having a thickness of about 30 nm (FIG. 1B). After that, isotropic etching of about 50 nm is performed on the nitride film 103 using hot phosphoric acid, so that a step 108 defined by the thermal oxidation film 106 and the nitride film 103 is slid from a position directly above the upper edge of the trench 105 to be inside the active region A.

In the case of forming a CVD oxide film on the step defined by the thermal oxidation film and the nitride film, since the CVD oxide film on the step has a composition different from that of other portions, an etching rate of the CVD oxide film is different from that of the other portions in the hydrofluoric acid etching to cause a shape abnormality called a divot which is a depression in the CVD oxide film. When the divot is generated above the trench upper edge, the size of the divot is increased in a trench depth direction by the hydrofluoric acid etching, a pretreatment, and the like, thereby thinning the thermal oxidation film on edges of the trench and exposing the edges. Such thinning and exposure will cause defects which deteriorate element separation properties.

Accordingly, the step 108 defined by the thermal oxidation film 106 and the nitride film 103 is slid to move the position on which the divot will occur to the active region. An amount of the movement, i.e. the preset nitride film recession amount M, is a distance between the divot and the trench upper edge which is required for preventing the divot from causing the deterioration in properties, and, of course, it is necessary to prevent the main element from being influenced by the sliding. Therefore, the preset nitride film recession amount M is set to about 50 nm in this embodiment.

Figure 1C:
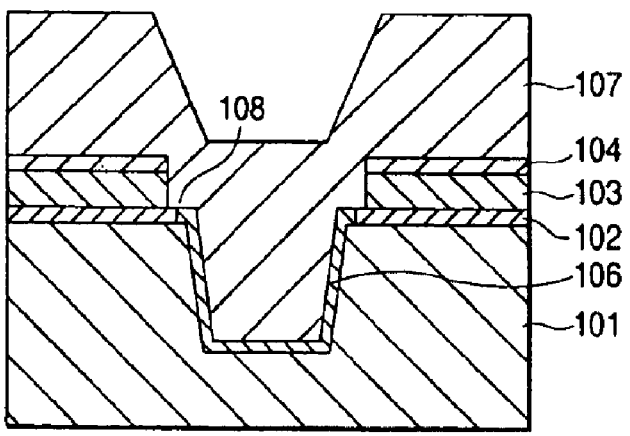
Figure 2A:
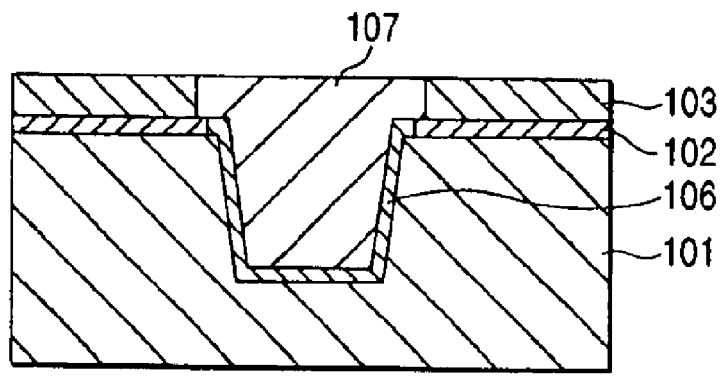
FIG. 2A to 2C are sectional views schematically showing the rest of the process according to the first embodiment of the present invention, wherein: shown in FIG. 2A is the view after removing the oxide film except for that on an element separation region by CMP; shown in FIG. 2B is the section after etching the oxide film inside the trench; and shown in FIG. 2C is the section after removing the nitride film and a protection oxide film.

Next, for the purpose of filling an inside of the trench 105 with an insulating material, a CVD oxide film 107, for example, is formed as a filling oxide film. (FIG. 1C). After that, the CVD oxide film 107 and the insulation film 104 formed on the nitride film 103 are removed by CMP (Chemical Mechanical Polishing) (FIG. 2A). Here, since an etching rate of the nitride film is lower than that of the CVD oxide film 107 and the insulation film 104 (CVD oxide film), the nitride film 103 serves as the etching stopper to remain as it is.

As the removing method, not only CMP but also a method wherein the CVD oxide film 107 on the active region A is removed by etching using a resist pattern for protecting the element separation region B may be employed. In that case, too, it is preferred to employ the etching method wherein the etching rate of the nitride film is lower than that of the CVD oxide films so as not to influence on the nitride film 103.

Figure 2B:
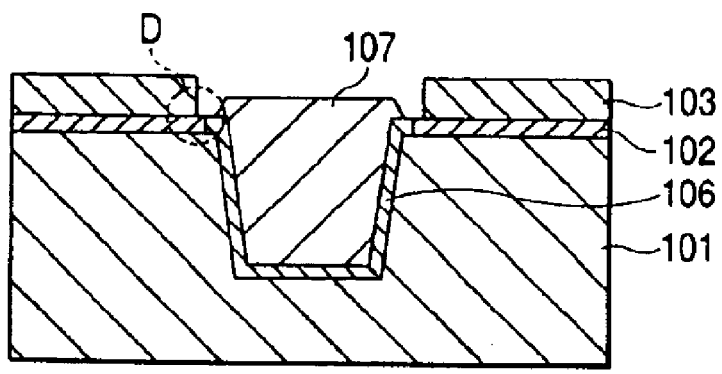
Figure 2C:
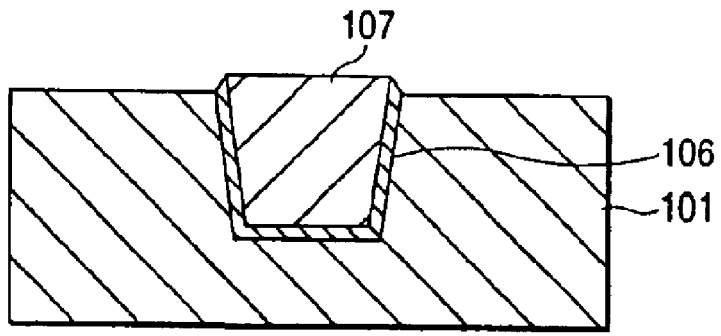

After that, etching is performed in order to adjust a height of the CVD oxide film 107 inside the trench 105 using hydrofluoric acid, so that a surface of the active region A is substantially level with a surface of the element separation region B (FIG. 2B). In the etching, a divot is formed at a position D of the step defined by the thermal oxidation film and the nitride film in the active region. After that, the nitride film 103 is removed by using a hot phosphoric acid solution, and the protection oxide film 102 on the substrate 101 is removed by using hydrofluoric acid (FIG. 2C). Here, since the position of the step defined by the thermal oxidation film and the nitride film on the upper edge of the trench 105 has been slid to be inside the active, the size of the divot is not increased if the hydrofluoric acid etching is increased in amount.

Since the surface of the nitride film 103 is protected by the insulation film 104 in advance of the nitride film recess etching in the first embodiment, the thickness of the nitride film 103 does not change even when a variation in the nitride film recess etching amount M is increased. Therefore, it is possible to avoid the problems such as deterioration in the variation in nitride film thickness after CMP and a difficulty in setting the etching amount for adjusting the height of the CVD oxide film inside the trench after CMP.

Further, though it has been necessary to form a relatively thicker film as the nitride film 103 in view of the change in thickness during the nitride film recess etching in the art, it is possible to reduce the thickness of the nitride film 103 in this embodiment because the thickness does not change owing to the protection of the nitride film 103 by the insulation film 104. Also, owing to the recess etching performed on the nitride film 103 and the insulation film 104 (CVD oxide film), it is possible to maintain a good coverage of the CVD oxide film which is used for filling up the inside of the trench 105.

(Second Embodiment)

Figure 3A:
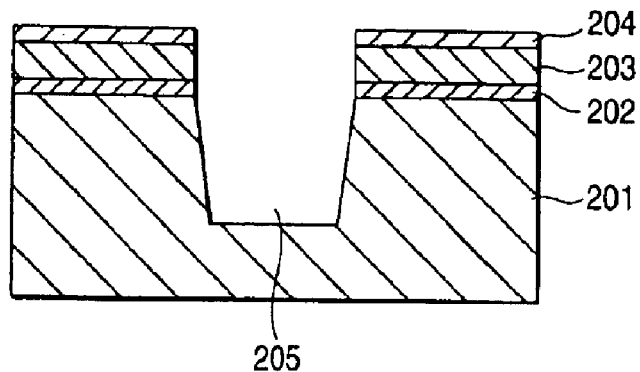
FIG. 3A to 3C are sectional views schematically showing a part of a process according to a second embodiment, wherein: shown in FIG. 3A is a section after forming a trench; shown in FIG. 3B is the section after performing nitride film recess etching and a rounding treatment; and shown in FIG. 3C is the section after forming on a whole surface an oxide film with which the trench is filled.

Shown in FIGS. 3A to 4C is an STI process flow according to the second embodiment. A protection oxide film 202 having a thickness of about 15 nm is formed on a silicon substrate 201 by oxidation, and then a nitride film 203 is formed by LPCVD, followed by forming a polysilicon film 204 (or an amorphous silicon film) having a thickness of about 10 nm on the nitride film 203 as a protection film by LPCVD. After that, a trench 205 is formed in an element separation region in the same manner as in the first embodiment (FIG. 3A).

Figure 3B:
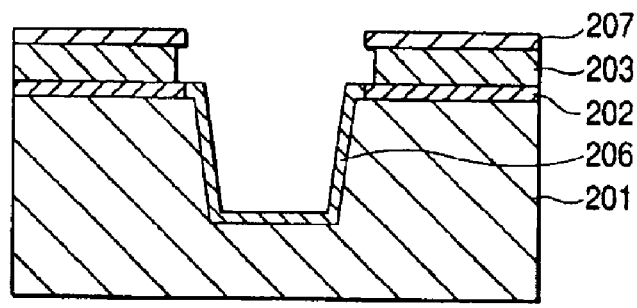

Then, a heat treatment (rounding oxidation) is performed for the purposes of preventing damage and occurrence of crystal defect on a silicon surface of the trench 205 and rounding corners of upper edges of the trench 205 to form a thermal oxidation film 206 having a thickness of about 30 nm. The polysilicon film 204 is simultaneously oxidized by the heat treatment to be modified into an oxide film 207 (FIG. 3B). After that, recess etching of about 50 nm is performed on the nitride film 203 using hot phosphoric acid so as to slide a step which is defined by the thermal oxidation film 206 and the nitride film 203 on a position directly above the upper edge of the trench 205 to be inside an active region.

Figure 3C:
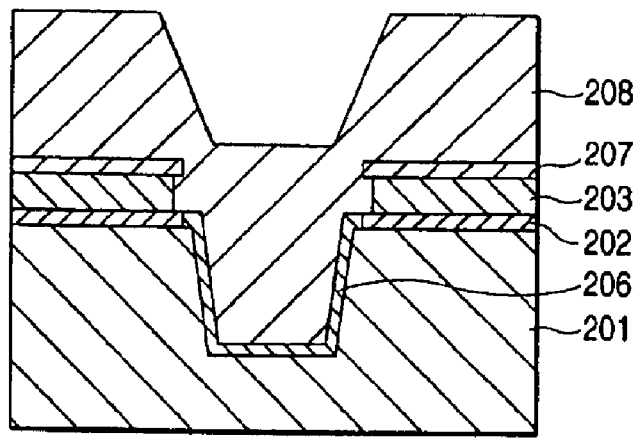
Figure 4A:
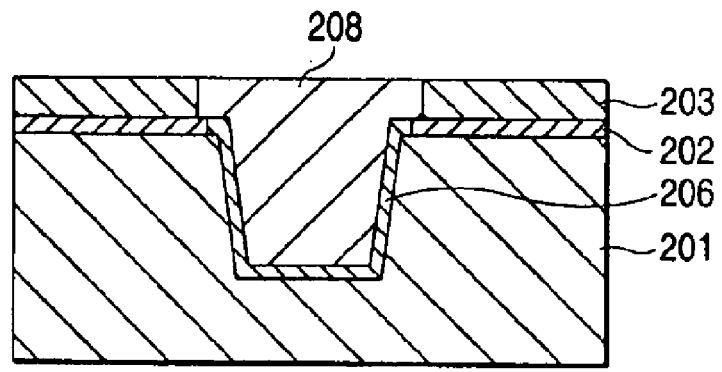
FIGS. 4A to 4C are sectional views schematically showing the rest of the process according to the second embodiment of the present invention, wherein: shown in FIG. 4A is the section after removing the oxide film except for that on an element separation region by CMP; shown in FIG. 4B is the section after etching the oxide film inside the trench; and shown in FIG. 4C is the section after removing the nitride film and a protection oxide film.
Figure 4B:
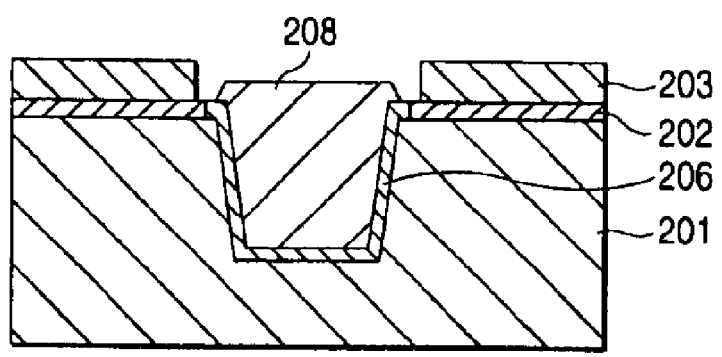
Figure 4C:
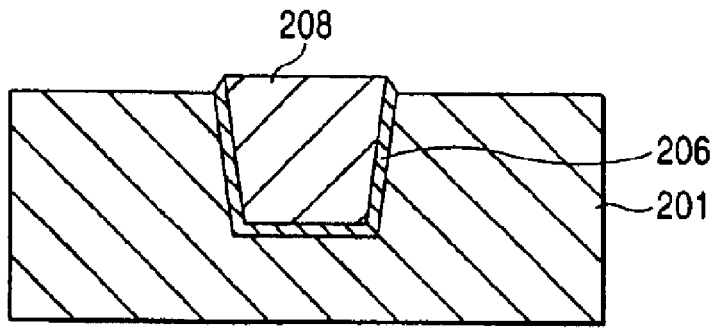

Next, a CVD oxide film 208 is formed as a filling oxide film for filling up an inside of the trench 205 (FIG. 3C). After that, the CVD oxide film 208 and the oxide film 207 on the nitride film 203 are removed by CMP in the same manner as in the first embodiment (FIG. 4A). Then, after performing etching in order to adjust a height of the CVD oxide film 208 inside the trench 205 (FIG. 4B), the nitride film 203 is removed by using a hot phosphoric acid solution, and the protection oxide film 202 on the substrate 201 is removed by using hydrofluoric acid (FIG. 4C).

Since the position of the step defined by the thermal oxidation film and the nitride film on the trench upper edge is slid to be inside the active region in this embodiment, too, the element properties are free from the influence otherwise caused by enlargement of the divot even when the amount of the hydrofluoric acid etching is increased. Further, since the nitride film 203 is protected by the oxide film 207 in advance of the nitride film recess etching, the thickness of the nitride film 203 does not change even when the variation in nitride film recession amount is increased. Therefore, it is possible to avoid problems such as deterioration in variation in nitride film thickness after CMP and a difficulty in setting the etching amount for adjusting the height of the CVD oxide film inside the trench after CMP.

Further, though it is necessary to perform the recess etching on the insulation film protecting the nitride film in the first embodiment, an effect of eliminating the recess etching on the oxide film 207 is achieved in this embodiment since the polysilicon film 204 (oxide film 207) is recessed toward an active region during the heat treatment in which the polysilicon film 204 is modified into the oxide film 207. Also, though there is an apprehension in the case of using hydrofluoric acid in a pre-washing treatment before the rounding oxidation in the first embodiment that the insulation film 104 (CVD oxide film) can be removed in some cases as a result of reduction in thickness due to the pretreatment, this embodiment is free from such apprehension because the polysilicon film 204 is free from influence of the hydrofluoric acid during the pretreatment. In addition, the same effect is attained in the case of using the amorphous silicon film in place of the polysilicon film.

(Third Embodiment)

Figure 5A:
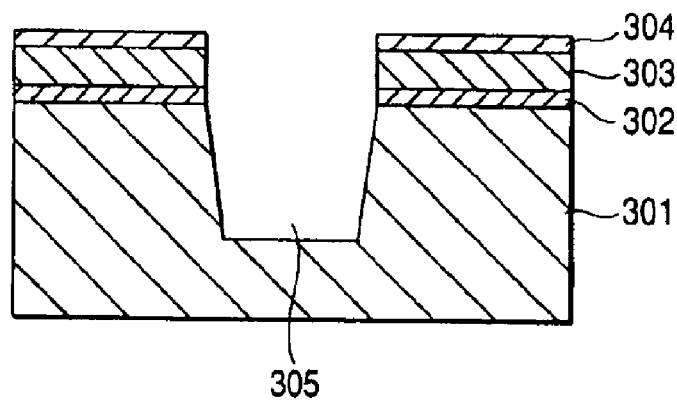
FIG. 5A to 5C are sectional views schematically showing a part of a process according to a third embodiment, wherein: shown in FIG. 5A is a section after forming a trench; shown in FIG. 5B is the section after forming an oxide film on a whole surface; and shown in FIG. 5C is the section after forming sidewall spacers.
Figure 5B:
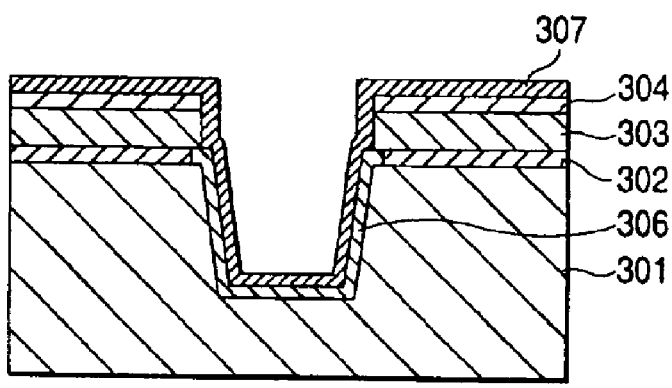

Shown in FIGS. 5A to 6C is an STI process flow according to the third embodiment. A protection oxide film 302 having a thickness of about 15 nm is formed on a silicon substrate 301 by oxidation, and then a nitride film 303 is formed by LPCVD. Then, a CVD oxide film having a thickness of about 40 nm is formed as an insulation film 304 for protecting the nitride film by, for example, LPCVD. After that, a trench 305 is formed in an element separation region in the same manner as in the first embodiment (FIG. 5A).

Figure 5C:
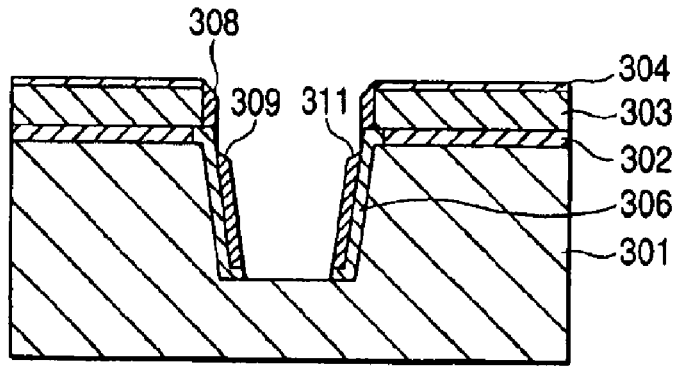

After forming the trench 305, a heat treatment (rounding oxidation) is performed for the purposes of preventing damage and occurrence of crystal defect on a silicon surface of the trench 305 and rounding corners of upper edges of the trench 305 to form a thermal oxidation film 306 having a thickness of about 30 nm. Then, after forming a CVD oxide film 307 on a whole surface as an oxide film for forming spacers (FIG. 5B), an etchback process employing dry etching is performed so as to etch the CVD oxide film 307 and the thermal oxidation film 306 on a flat portion, followed by forming the spacers 308, 309 on sidewalls of the nitride film 303 and the trench 305 as oxide film sidewall spacers having a step below a surface of the substrate 301 (FIG. 5C).

Of course, the spacers 308, 309 may be connected to each other at the step in so far as the step is below the substrate surface. Further, it is not critical if the insulation film 304 on the nitride film 303 is also etched.

The spacer 308 is formed in such a fashion as to contact with the nitride film 303 and an upper portion of the thermal oxidation film 306 formed inside the trench 305, and the spacer 309 is formed inside the trench 305 in such a fashion as to contact with a portion of the thermal oxidation film 306 extending from an upper portion to a bottom of the trench 305. The step defined by the nitride film 303 and the thermal oxidation film 306 is covered with the spacer 308, and the step defined by the spacer 308 and the spacer 309 is located at a position 311 which is inside the trench 305 and below the surface of the substrate 301.

Figure 6A:
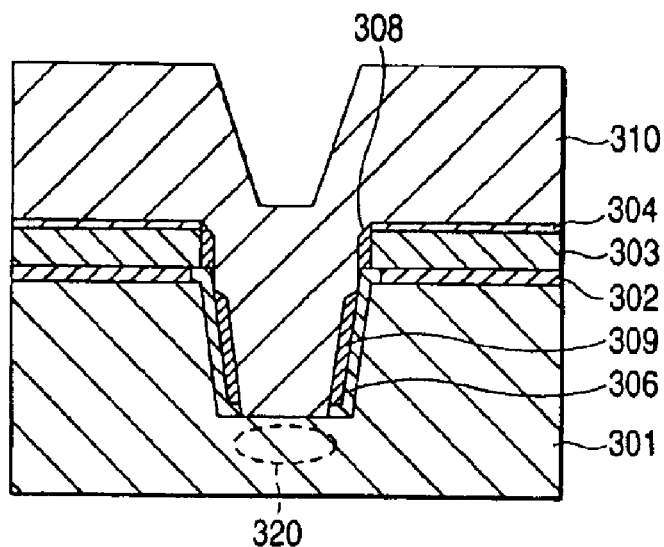
FIGS. 6A to 6C are sectional views schematically showing the rest of the process according to the third embodiment, wherein: shown in FIG. 6A is the section after forming an oxide film with which the trench is filled; shown in FIG. 6B is the section after removing the oxide film except for that on an element separation region by CMP and etching the oxide film inside the trench.
Figure 6B:
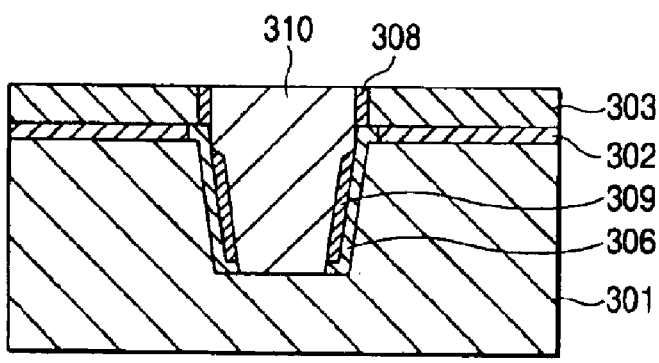
Figure 6C:
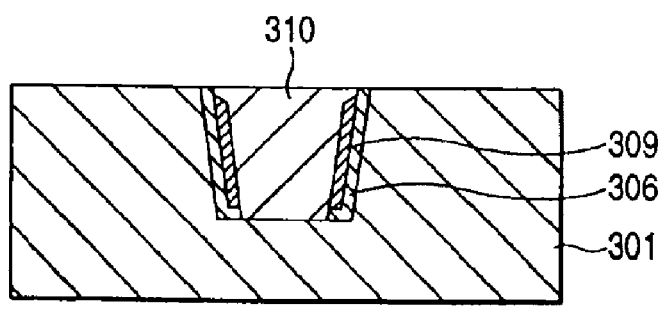

After that, a CVD oxide film 310 is formed as a filling oxide film for filling up the inside of the trench 305 (FIG. 6A). Then, the CVD oxide film 310 on the nitride film 303 is removed by CMP in the same manner as in the first embodiment (FIG. 6B). After performing etching for adjusting a height of the CVD oxide film 310 inside the trench 305, the nitride film 303 is removed by using a hot phosphoric acid solution, and the protection oxide film 302 on the substrate 301 is removed by using hydrofluoric acid (FIG. 6C).

Thus, in the third embodiment, the step which is the cause of the divot generation exists at the position 311 below the silicon substrate, and a position on which the materials of the CVD oxide film 310 and other regions are different from one another is located on the position 311; therefore, it is possible to perform the etching which causes no divot and achieves a uniform surface. Consequently, it is possible to avoid the problems such as deterioration in variation in nitride film thickness after CMP and a difficulty in setting the etching amount for adjusting the height of the CVD oxide film inside the trench after CMP. Further, it is unnecessary to perform the nitride film recess etching which is performed in the first and the second embodiments for the purpose of sliding the step defined by the nitride film and the thermal oxidation film to be inside the active region.

(Fourth Embodiment)

Figure 7A:
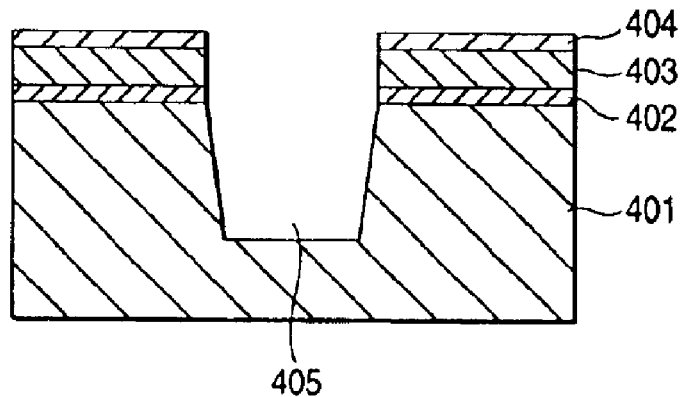
FIG. 7A to 7C are sectional views schematically showing a part of a process according to a fourth embodiment, wherein: shown in FIG. 7A is a section after forming a trench; shown in FIG. 7B is the section after forming a polysilicon on a whole surface; and shown in FIG. 7C is the section after forming sidewall spacers.
Figure 7B:
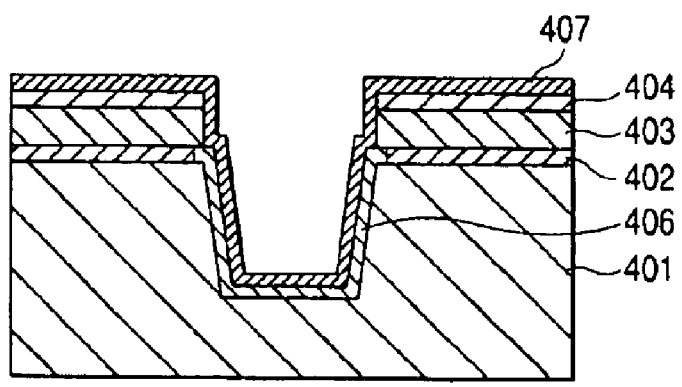

Shown in FIGS. 7A to 8C is an STI process flow according to the fourth embodiment. A protection oxide film 402 having a thickness of about 15 nm is formed on a substrate 401 by oxidation, and then a nitride film 403 is formed by LPCVD. Then, a CVD oxide film having a thickness of about 40 nm is formed on the nitride film 403 as an insulation film 404 for protecting the nitride film by LPCVD. After that, a trench 405 is formed in an element separation region in the same manner as in the first embodiment (FIG. 7A).

Figure 7C:
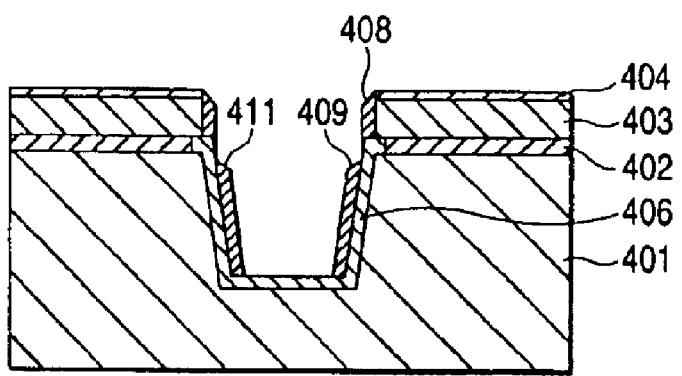

Then, a heat treatment (rounding oxidation) is performed for the purposes of preventing damage and occurrence of crystal defect on a silicon surface of the trench 405 and rounding corners of upper edges of the trench 405 to form a thermal oxidation film 406 having a thickness of about 30 nm. After that, a polysilicon film (or an amorphous silicon film) 407 having a thickness of about 20 nm is formed on a whole surface by LPCVD (FIG. 7B), and then an etchback process employing dry etching is performed so as to etch the polysilicon film (or the amorphous silicon film) 407 and the thermal oxidation film 406 on a flat portion, followed by forming spacers 408, 409 on sidewalls of the nitride film 403 and the trench 405 as polysilicon film sidewall spacers having a step below a surface of the substrate 401 (FIG. 7C).

As is the case with the third embodiment, the spacers 408, 409 may be connected to each other at the step in so far as the step is below the substrate surface. Also, it is not critical if the insulation film 404 on the nitride film 403 is also etched. Further, by employing etching conditions wherein etching selectivity ratios for the polysilicon film and the oxide film are higher, the thermal oxidation film on a bottom of the trench 405 is not etched and the silicon on the bottom is not exposed.

The spacer 408 is formed in such a fashion as to contact with the nitride film 403 and an upper portion of the thermal oxidation film 406 formed inside the trench 405, and the spacer 409 is formed inside the trench 405 in such a fashion as to contact with a portion of the thermal oxidation film 406 extending from an upper portion to the bottom of the trench 405. The step defined by the nitride film 403 and the thermal oxidation film 406 is covered with the spacer 408, and the step defined by the spacer 408 and the spacer 409 is at a position 411 which is inside the trench 405 and below the surface of the substrate 401.

Figure 8A:
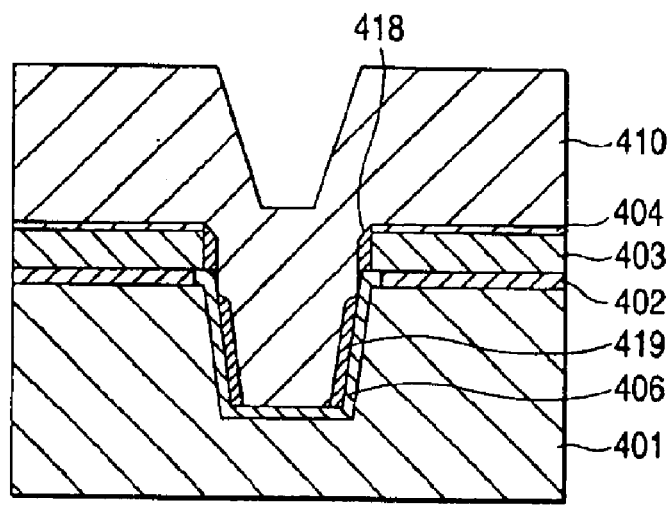
FIGS. 8A to 8C are sectional views schematically showing the rest of the process according to the fourth embodiment, wherein: shown in FIG. 8A is the section after forming on a whole surface an oxide film with which the trench is filled; shown in FIG. 8B is the section after removing the oxide film except for that on an element separation region by CMP and etching the oxide film inside the trench; and shown in FIG. 8C is the section after removing a nitride film and a protection oxide film.
Figure 8B:
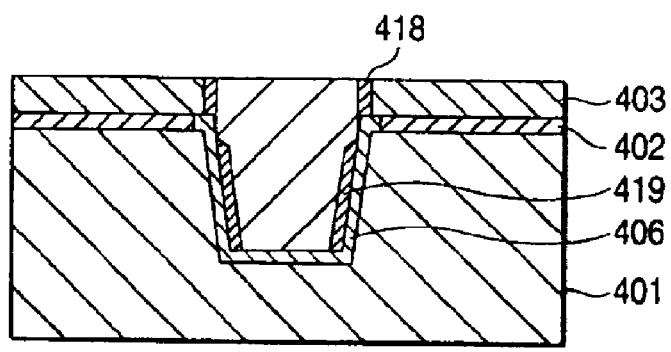
Figure 8C:
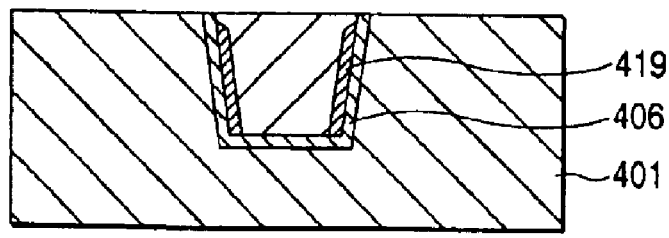
Figure 9A:
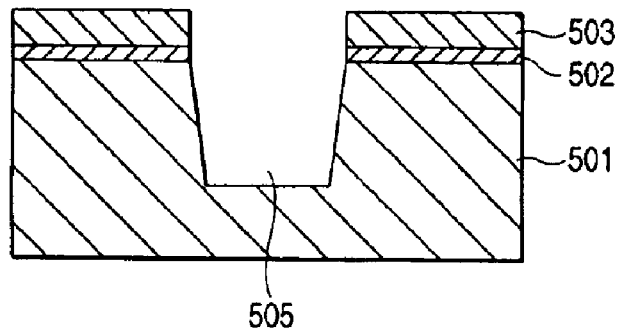
FIG. 9A to 9C are sectional views schematically showing a part of a process according to a conventional technology, wherein: shown in FIG. 9A is a section after forming a trench; shown in FIG. 9B is the section after forming on a whole surface an oxide film with which the trench is filled; and shown in FIG. 9C is the section after removing the oxide film except for that on an element separation region by CMP.
Figure 9B:
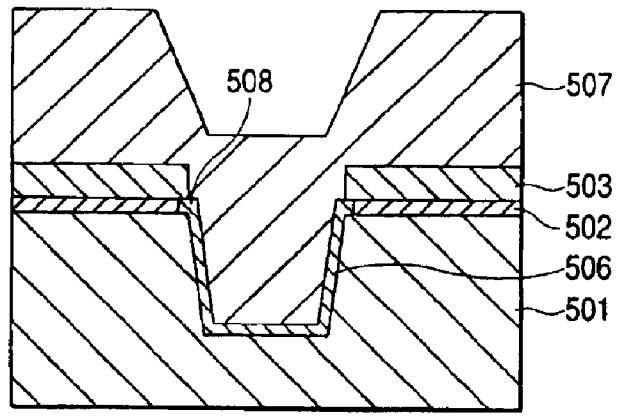
Figure 9C:
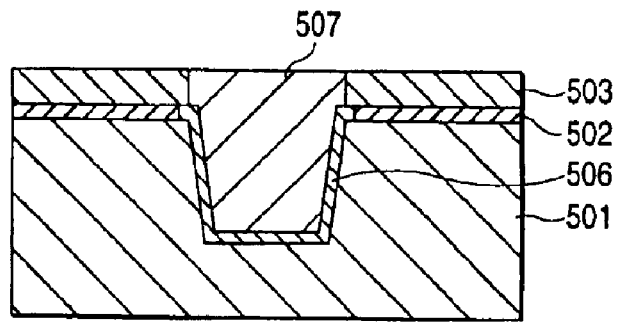
Figure 10A:
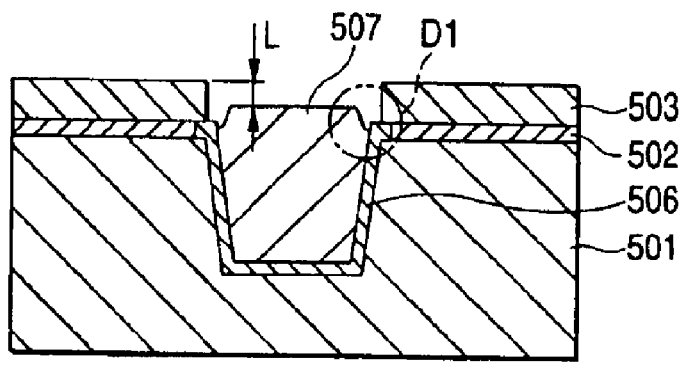
FIGS. 10A and 10B are sectional views schematically showing the rest of the process according to the conventional technology, wherein: shown in FIG. 10A is the section after etching the oxide film inside the trench; and shown in FIG. 10B is the section after removing a nitride film and a protection oxide film.
Figure 10B:
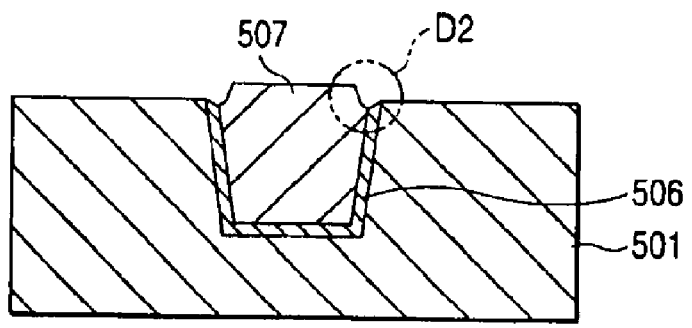
Figure 11A:
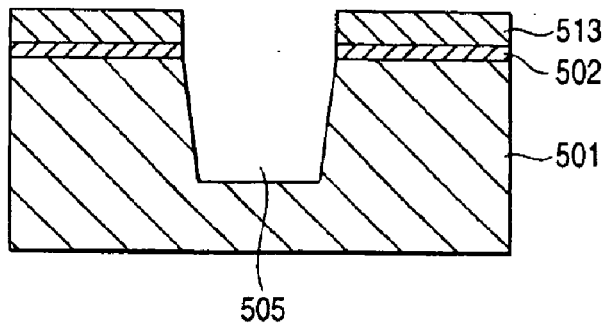
FIG. 11A to 11C are sectional views schematically showing a part of a process according to another conventional technology, wherein: shown in FIG. 11A is a section after forming a trench; shown in FIG. 11B is the section performing nitride film recess etching; and shown in FIG. 11C is the section after forming on a whole surface an oxide film with which the trench is filled.
Figure 11B:
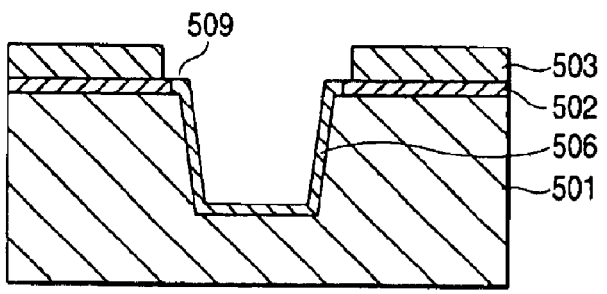
Figure 11C:
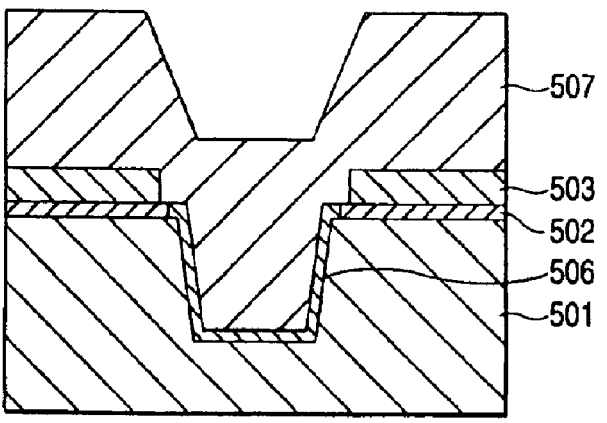
Figure 12A:
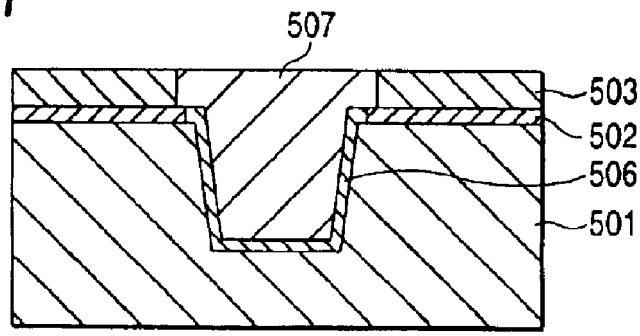
FIGS. 12A and 12C are sectional views schematically showing the rest of the process according to the conventional technology, wherein: shown in FIG. 12A is the section after removing the oxide film except for that on an element separation region by CMP; shown in FIG. 12B is the section after etching the oxide film inside the trench; and shown in FIG. 12C is the section after removing the nitride film and a protection oxide film.
Figure 12B:
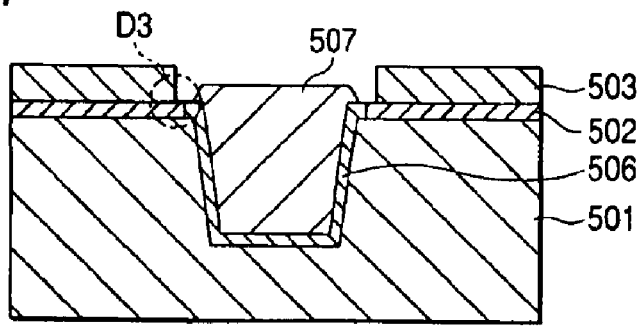
Figure 12C:
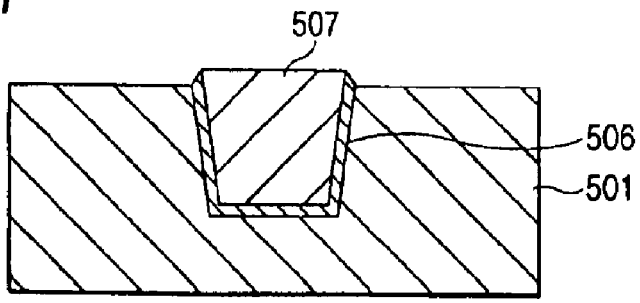

After that, a heat treatment is performed to modify the polysilicon (or amorphous silicon) spacers 408, 409 into oxide film spaces 418, 419. Then, a CVD oxide film 410 is formed as a filling oxide film for filling up the inside of the trench 405 (FIG. 8A). Then, the CVD oxide film 410 and the nitride film protection film 404 on the nitride film 403 are removed by CMP in the same manner as in the first embodiment (FIG. 8B). After performing etching for adjusting a height of each of the CVD oxide film 410 inside the trench 405 and the spacer 418, the nitride film 403 is removed by using a hot phosphoric acid solution, and the protection oxide film 402 on the substrate 401 is removed by using hydrofluoric acid (FIG. 8C).

As is the case with the third embodiment, the step inside the trench, which is the cause of the divot generation, exists at the position 411 below the silicon substrate, and a position on which the materials of the CVD oxide film 410 and other regions are different from one another is located on the position 411 in this embodiment; therefore, it is possible to perform the hydrofluoric acid etching which causes no divot and achieves an uniform surface. Consequently, it is possible to avoid the problems such as deterioration in variation in nitride film thickness after CMP and a difficulty in setting the etching amount for adjusting the height of the CVD oxide film inside the trench after CMP. Further, it is unnecessary to perform the nitride film recess etching for sliding the step defined by the nitride film and the thermal oxidation film to be inside the active region.

Also, there is an apprehension in the third embodiment that, because the silicon at the trench bottom is exposed after the spacer etching, damage 320 (FIG. 6A) occurs on the silicon substrate on the trench bottom during filling the trench inside with the CVD oxide film to cause the crystal defect. However, in this embodiment, it is possible to prevent such silicon exposure after the etching as a result of employing the etching conditions wherein the etching selectivity ratios for the polysilicon film and the oxide film are higher, thereby preventing the damage from being generated on the silicon substrate. In addition, the same effect is achieved in the case of using the amorphous silicon film in place of the polysilicon film.

Though the method for manufacturing semiconductor elements of the present invention are described in the foregoing in conjunction with the preferred embodiments thereof and with reference to the accompanying drawings, this invention is not limited to the embodiments, and various alternatives and modifications are apparent for those skilled in the art within the technical spirit and scope of the invention recited in appended claims; therefore, it is naturally understood that such alternatives and modifications belong to the technical scope of the invention.

As described in the foregoing, according to the method for manufacturing the semiconductor element of the invention, since the trench is formed after forming the protection insulation film on the nitride film and then the nitride film recess etching is performed in the STI process, the recess etching causes no reduction nor variation in thickness of the nitride film, and it is possible to reduce the occurrence of divot by sliding a step defined by the thermal oxidation film and the nitride film on the upper edge of the trench without influencing on other process steps.

What is claimed is:

1. A method for manufacturing a semiconductor element using Shallow Trench Isolation, comprising sequential steps of:
    forming, on a substrate on which a protection oxide film for protecting an active region and a nitride film to be used as an etching stopper are formed in this order, an insulation film for protecting the nitride film;
    etching the insulation film, the nitride film, the protection oxide film, and the substrate on the semiconductor element separation region to form a trench;
    etching the insulation film to widen its aperture toward an inside of the active region;
    performing a heat treatment to form a thermal oxidation film inside the trench;
    etching the nitride film using the insulation film with the widened aperture as a mask to move a step defined by the thermal oxidation film and the nitride film from an upper edge of the trench toward the inside of the active region;
    forming a filling oxide film for burying the trench;
    selectively etching the filling oxide film and the insulation film to expose the nitride film;
    etching the filling oxide film inside the trench so that a surface of the substrate is substantially level with a surface of the filling oxide film; and
    removing the nitride film and the protection oxide film.

2. A method for manufacturing a semiconductor element according to claim 1, wherein
    the insulation film is an oxide film.

3. A method for manufacturing a semiconductor element according to claim 2, wherein
    the selective etching for the filling oxide film and the insulation film is Chemical Mechanical Polishing.

4. A method for manufacturing a semiconductor element according to claim 3, wherein
    the nitride film is scarcely etched in the selective etching for the filling oxide film and the insulation film.

5. A method for manufacturing a semiconductor element according to claim 4, wherein
    an aperture of the insulation film is widened by about 50 nm toward the inside of the active region in the step of widening the aperture of the insulation film toward the inside of the active region.

6. A method for manufacturing a semiconductor element using Shallow Trench Isolation, comprising:
    forming, on a substrate on which a protection oxide film for protecting an active region and a nitride film to be used as an etching stopper are formed in this order, a polysilicon film for protecting the nitride film;
    etching the polysilicon film, the nitride film, the protection oxide film, and the substrate on the semiconductor element separation region to form a trench;
    performing a heat treatment to form a thermal oxidation film inside the trench and to modify the polysilicon film into an oxide film;
    etching the nitride film using the oxide film as a mask and to move a step defined by the thermal oxidation film and the nitride film from an upper edge of the trench toward the inside of the active region;
    forming a filling oxide film for burying the trench;
    selectively etching the filling oxide film and the oxide film to expose the nitride film;
    etching the filling oxide film inside the trench so that a surface of the substrate is substantially level with a surface of the filling oxide film; and
    removing the nitride film and the protection oxide film.

7. A method for manufacturing a semiconductor element according to claim 6, wherein
    the polysilicon film is replaced by an amorphous silicon film.

8. A method for manufacturing a semiconductor element according to claim 6, wherein the selective etching for the filling oxide film and the oxide film is Chemical Mechanical Polishing.

9. A method for manufacturing a semiconductor element according to claim 6, wherein
    the nitride film is scarcely etched in the selective etching for the filling oxide film and the oxide film.

10. A method for manufacturing a semiconductor element using Shallow Trench Isolation, comprising:
    forming, on a substrate on which a protection oxide film for protecting an active region and a nitride film to be used as an etching stopper are formed in this order, an insulation film for protecting the nitride film;
    etching the insulation film, the nitride film, the protection oxide film, and the substrate on the semiconductor element separation region to form a trench;
    performing a heat treatment to form a thermal oxidation film inside the trench;
    forming an oxide film to be used for forming spacers on a whole surface of the substrate and then forming oxide film sidewall spacers having a step below the substrate surface by etching back the oxide film;
    forming a filling oxide film for burying the trench;
    selectively etching the filling oxide film and the insulation film to expose the nitride film;

etching the filling oxide film inside the trench and the oxide film sidewall spacers so that the substrate surface is substantially level with a surface of the filling oxide film; and removing the nitride film and the protection oxide film.

11. A method for manufacturing a semiconductor element according to claim 10, wherein the insulation film is an oxide film.

12. A method for manufacturing a semiconductor element according to claim 11, wherein the selective etching for the filling oxide film and the insulation film is Chemical Mechanical Polishing.

13. A method for manufacturing a semiconductor element according to claim 12, wherein the nitride film is scarcely etched in the selective etching for the filling oxide film and the insulation film.

14. A method for manufacturing a semiconductor element using Shallow Trench Isolation, comprising:

forming, on a substrate on which a protection oxide film for protecting an active region and a nitride film to be used as an etching stopper are formed in this order, an insulation film for protecting the nitride film;

etching the insulation film, the nitride film, the protection oxide film, and the substrate on the semiconductor element separation region to form a trench;

performing a heat treatment to form a thermal oxidation film inside the trench;

forming a polysilicon film on a whole surface of the substrate to form polysilicon film sidewall spacers on a sidewall of the trench by etching back the polysilicon film, the spacers having a step below the substrate surface;

performing a heat treatment to modify the polysilicon film sidewall spacers into oxide film sidewall spacers;

forming a filling oxide film for burying the trench;

selectively etching the filling oxide film and the insulation film to expose the nitride film;

etching the filling oxide film inside the trench and the oxide film sidewall spacers so that the substrate surface is substantially level with a surface of the filling oxide film; and removing the nitride film and the protection oxide film.

15. A method for manufacturing a semiconductor element according to claim 14, wherein the polysilicon film is replaced by an amorphous silicon film.

16. A method for manufacturing a semiconductor element according to claim 14, wherein the insulation film is an oxide film.

17. A method for manufacturing a semiconductor element according to claim 16, wherein the selective etching for the filling oxide film and the insulation film is Chemical Mechanical Polishing.

18. A method for manufacturing a semiconductor element according to claim 17, wherein the nitride film is scarcely etched in the selective etching for the filling oxide film and the oxide film.

19. A method for manufacturing a semiconductor element according to claim 18, wherein the thermal oxidation film on a bottom of the trench is scarcely etched in the formation of the polysilicon film sidewall spacers by etching back the polysilicon film.

* * * * *